(12) United States Patent
Kanzaki et al.

(10) Patent No.: US 12,117,707 B2
(45) Date of Patent: Oct. 15, 2024

(54) DISPLAY DEVICE AND METHOD FOR MANUFACTURING DISPLAY DEVICE

(71) Applicant: Sharp Kabushiki Kaisha, Sakai (JP)

(72) Inventors: Yohsuke Kanzaki, Sakai (JP); Takao Saitoh, Sakai (JP); Masahiko Miwa, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 17/917,062

(22) PCT Filed: Apr. 20, 2020

(86) PCT No.: PCT/JP2020/017048
§ 371 (c)(1),
(2) Date: Oct. 5, 2022

(87) PCT Pub. No.: WO2021/214829
PCT Pub. Date: Oct. 28, 2021

(65) Prior Publication Data
US 2023/0152647 A1 May 18, 2023

(51) Int. Cl.
*G02F 1/1368* (2006.01)
*H10K 59/12* (2023.01)
*H10K 59/121* (2023.01)

(52) U.S. Cl.
CPC ....... *G02F 1/1368* (2013.01); *H10K 59/1201* (2023.02); *H10K 59/1213* (2023.02)

(58) Field of Classification Search
CPC ............ G02F 1/1368; G02F 1/133305; H10K 59/1201; H10K 59/1213; H10K 59/122; H10K 59/123; H10K 2102/311; H10K 59/131; Y02E 10/549; G09F 9/30
See application file for complete search history.

(56) References Cited

U.S. PATENT DOCUMENTS

2018/0090549 A1* 3/2018 Hamada ................. H10K 59/35
2018/0138431 A1  5/2018 Nishimura
2018/0145125 A1* 5/2018 Lee ....................... H10K 77/111

FOREIGN PATENT DOCUMENTS

JP  2018-049774 A  3/2018
JP  2018-078057 A  5/2018
JP  2019-061007 A  4/2019

OTHER PUBLICATIONS

Official Communication issued in International Patent Application No. PCT/JP2020/017048, mailed on Jun. 23, 2020.

* cited by examiner

*Primary Examiner* — Paisley L Wilson
*Assistant Examiner* — Agnes Dobrowolski
(74) *Attorney, Agent, or Firm* — Keating & Bennett, LLP

(57) ABSTRACT

A display device of the present disclosure has the following: a display region including a thin-film transistor; a frame region surrounding the display region; a terminal section provided in the frame region; a resin layer provided above a base; an inorganic insulating layer provided on the resin layer and having an opening; and a conductive pattern provided on the inorganic insulating layer in a location except a location over the opening.

4 Claims, 18 Drawing Sheets

DISPLAY DEVICE AND METHOD FOR MANUFACTURING DISPLAY DEVICE

TECHNICAL FIELD

The present disclosure relates to a display device and a method for manufacturing the display device.

BACKGROUND ART

In the rerated art, flexible display devices have been developed using a base with flexibility. For instance, Patent Literature 1 discloses a display device with a portion where wires are formed on a base being folded back to the backside of a display region, in a component-mounted region where components, including a flexible printed board and a drive circuit, are mounted.

CITATION LIST

Patent Literature

Patent Literature 1: Japanese Unexamined Patent Application Publication No. 2018-78057

SUMMARY

Technical Problem

The display region and component-mounted region of the above display device have a stack of a plurality of insulating layers for adjusting wire height or for insulating wires from each other. These insulating layers include a resin layer formed of a resin material. The resin layer sometimes emits gas when heated for curing. The resin layer also sometimes emits gas upon heat application even after cured. Accordingly, covering the resin layer with a material that less allows gas to pass therethrough causes gas emitted from the resin layer to accumulate between the resin layer and this cover material (for instance, an inorganic insulating layer formed of an inorganic material). As a result, the accumulated gas possibly removes the resin layer and the cover material from each other.

The present disclosure has been made in view of this problem. One aspect of the present disclosure provides a display device and a method for manufacturing the display device that can prevent a resin layer and a material covering the resin layer from removal.

Solution to Problem

A display device of the present disclosure has the following: a display region including a thin-film transistor; a frame region surrounding the display region; a terminal section provided in the frame region; a resin layer provided above a base; an inorganic insulating layer provided on the resin layer and having an opening; and a conductive pattern provided on the inorganic insulating layer in a location except a location over the opening.

A method for manufacturing a display device of the present disclosure includes the following: forming a resin layer above a base; forming an inorganic insulating layer onto the resin layer; forming a conductive pattern onto the inorganic insulating layer; and forming an opening in the inorganic insulating layer.

Advantageous Effect of Invention

One aspect of the present disclosure provides a display device and a method for manufacturing the display device that can prevent a resin layer and a material covering the resin layer from removal.

DESCRIPTION OF EMBODIMENTS

The embodiments of the present disclosure will be described with reference to the drawings. Identical or equivalent components will be denoted by the same signs throughout the drawings. The description of identical or equivalent components in the respective embodiments will not be repeated.

First Embodiment

Figure 1:
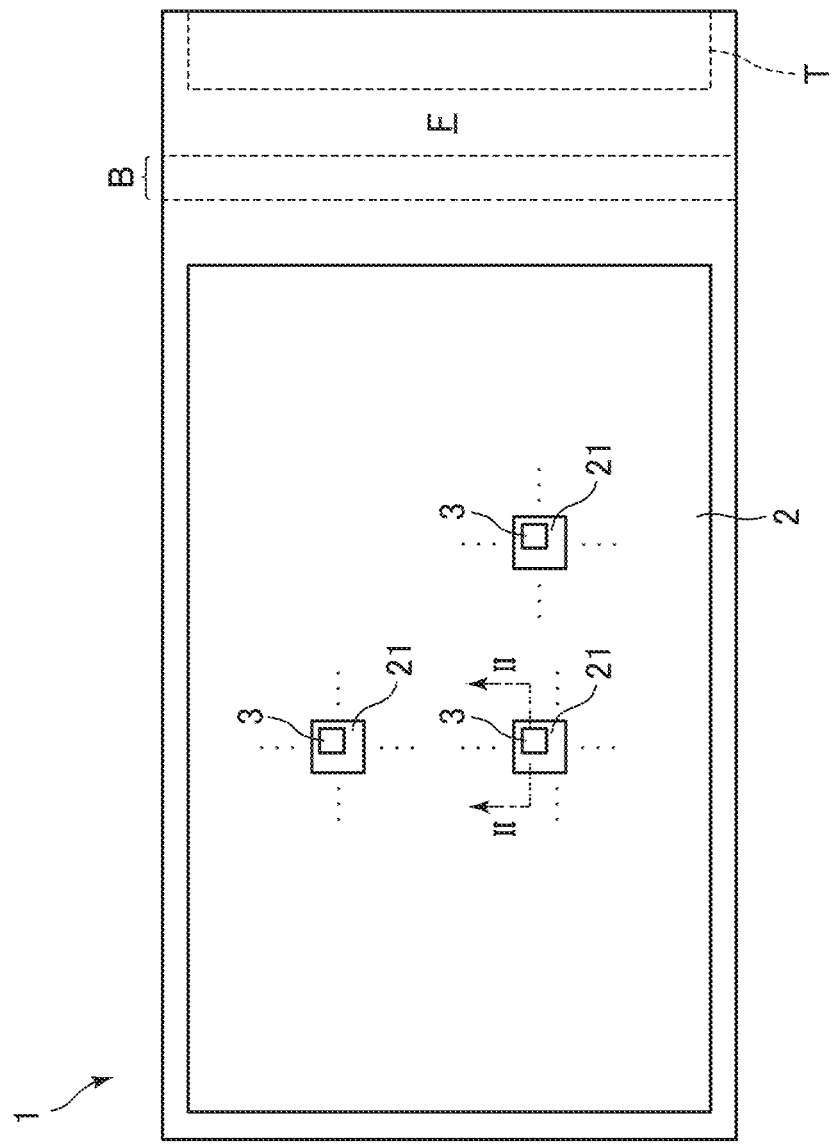
FIG. 1 is a schematic plan view of a display device according to a first embodiment.

FIG. 1 is a schematic plan view of a display device 1 according to a first embodiment.

The display device 1 has a display region 2 and a frame region F surrounding the display region 2. The frame region F includes a bending portion B and a terminal section T. In the frame region F, the bending portion B is provided between the display region 2 and the terminal section T.

As illustrated in FIG. 1, the display region 2 has a plurality of pixels 21 arranged, for instance, in matrix. Each of the plurality of pixels 21 is provided with a thin-film transistor (hereinafter, TFT) 3. Although not shown, the terminal section T is provided with a plurality of terminals, and the plurality of terminals are electrically connected to an electric circuit and a control circuit both placed in the terminal section T. The X-direction in FIG. 1 is a first direction, and a Y-direction intersecting with the first direction is a second direction. The X-direction and the Y-direction are orthogonal to each other in a plan. The X-direction and the Y-direction correspond to the lateral direction and longitudinal direction of the display device 1, which has a rectangular outline. The display region 2, the bending portion B, and the terminal section T are arranged in the first direction.

The first direction is not limited to the X-direction; the first direction may be any direction from the display region 2 to the terminal section T. For instance, the first direction may be a direction oblique to the X-direction.

In FIG. 1, the terminal section T is folded back to the backside of the display region 2 by bending the bending portion B along an imaginary line in the Y-direction, which is a bending line. Accordingly, the back side surface of the terminal section T and the back side surface of the display region 2 are disposed to face each other. That is, part of the frame region F overlaps the display region 2 in a plan view. This can reduce the occupied area of the frame region F, thus achieving the display device 1 with a narrow frame.

Figure 2:
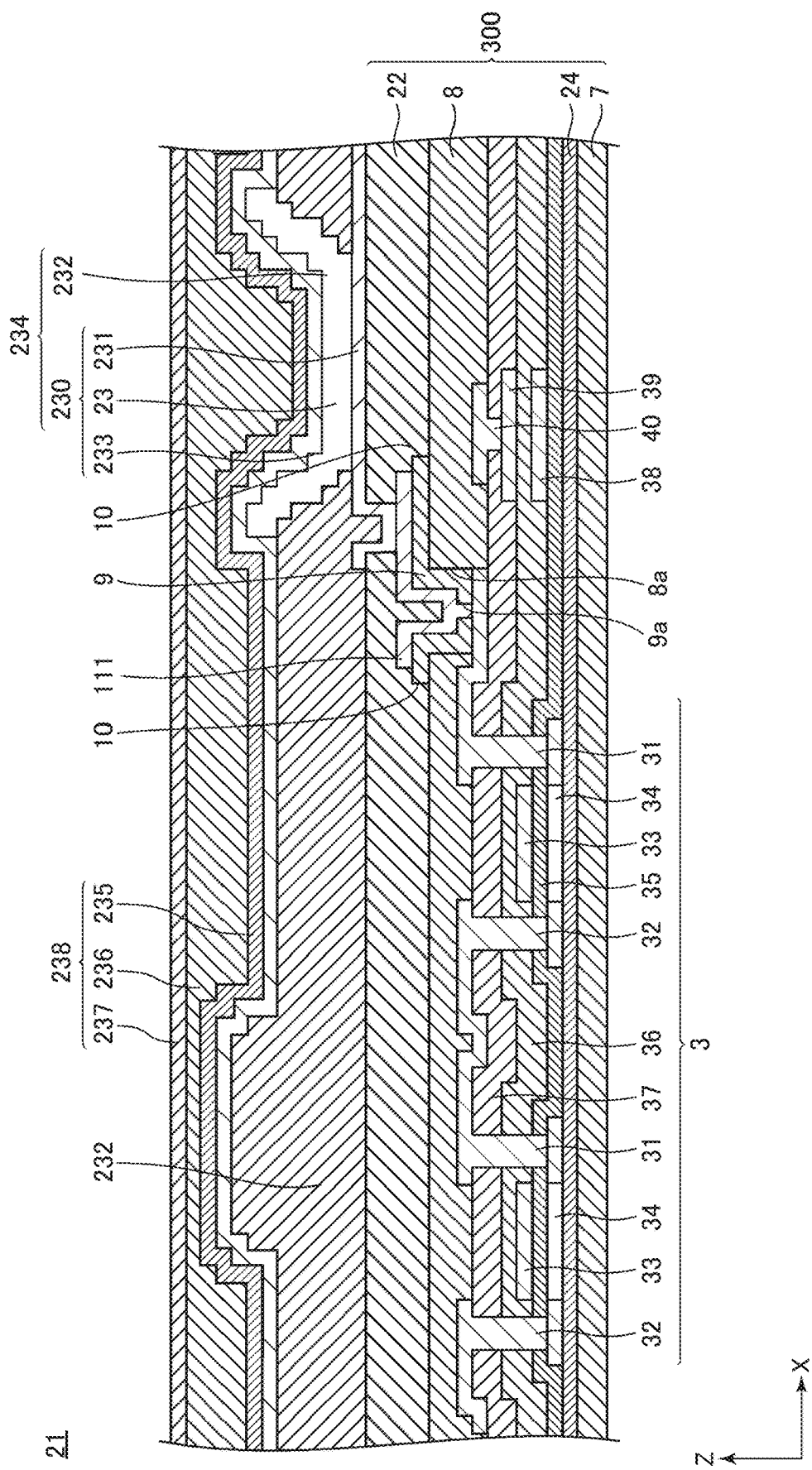
FIG. 2 is a sectional view taken along line II-II in FIG. 1.

FIG. 2 is a sectional view taken along line II-II in FIG. 1. FIG. 2 illustrates the partial sectional structure of the display region 2 taken mainly in the X-direction near the TFT 3 in the display region 2. In FIG. 2, the up-and-down direction of the display device 1 orthogonal to the X-direction is defined as a Z-direction. In the Description, the foregoing X-direction, Y-direction and Z-direction are each directions along the three axes of a rectangular coordinate system.

As seen from FIG. 2, the plurality of pixels 21 each include a light-emitting element 230, including a liquid crystal or an organic (electro-luminescence) EL element, and the TFT 3 for controlling the light-emitting element 230.

A base 7 is formed of, for instance, a resin material having flexibility.

A base coat film 24 is a layer provided on the base 7.

The TFT 3 is formed on the base coat film 24. The TFT 3 includes a channel portion, a semiconductor layer 34 including a source region and a drain region, a gate insulating film 35, a gate electrode 33, a drain electrode 31, a source electrode 32, a first interlayer film 36, and a second interlayer film 37.

Each of the plurality of pixels 21 also includes components, such as a gate wire 38, a high-voltage power-source line 40, and a capacitive wire 39. Although not shown, the display region 2 includes components, such as a light-emission control line, an initialization power-source line, and a source line. Part of the source electrode 32, part of the drain electrode 31, and the high-voltage power-source line 40 are formed to extend on the second interlayer film 37.

As seen from FIG. 2, a resin layer 8 and an inorganic insulating layer 9 are stacked on the TFT 3. The resin layer 8 is called a flattening film in some cases. The resin layer 8 and the inorganic insulating layer 9 respectively have a contact hole 8a and a contact hole 9a both extending to the drain electrode 31. The inorganic insulating layer 9 is removed excluding around the contact hole 8a and the contact hole 9a, thus forming an opening 10.

The inorganic insulating layer 9, a relay electrode 111, and a protective layer 22 are stacked on the resin layer 8. The relay electrode 111 is formed in the display region 2 so as to cover part of the inorganic insulating layer 9 and to fill the contact hole 9a. The relay electrode 111 is electrically connected to the drain electrode 31. Here, the relay electrode 111 is a kind of a conductive pattern 11, which will be described later on. FIG. 2 illustrates the relay electrode 111 connected to the drain electrode 31 of the TFT 3. The light-emitting element 230 and the TFT 3 are electrically connected together via the relay electrode 111. The relay electrode 111 is electrically connected to the drain electrode 31 of the TFT 3, the source electrode 32 of the TFT 3 is electrically connected to a source line (not shown), an end of the source line (not shown) is electrically connected to one of the ends of a first frame wire 20 (see FIG. 4 and FIG. 5), and the other end of the first frame wire 20 (see FIG. 4 and FIG. 5) is electrically connected to one of the ends of the conductive pattern 11 (see FIG. 4 and FIG. 5) provided in the bending portion B, which will be described later on, via a contact hole 91 (see FIG. 4 and FIG. 5) provided in the first interlayer film 36, second interlayer film 37, resin layer 8 and inorganic insulating layer 9 (see FIG. 5); the details will be described later on. The other end of the conductive pattern 11 (see FIG. 4 and FIG. 5) is electrically connected to one of the ends of a second frame wire 51 (see FIG. 4 and FIG. 5) via a contact hole 91 (see FIG. 4 and FIG. 5) provided in the first interlayer film 36, second interlayer film 37, resin layer 8 and inorganic insulating layer 9 (see FIG. 5) on the one end of the second frame wire 51 (see FIG. 4 and FIG. 5). The other end of the second frame wire 51 (see FIG. 4. and FIG. 5) is electrically connected to a terminal (not shown) in the terminal section T. The relay electrode 111 is formed of the same material as the conductive pattern 11 (see FIG. 4. and FIG. 5), which will be described later on, and is formed in the same layer as a layer where the conductive pattern 11 (see FIG. 4. and FIG. 5) is formed.

The protective layer 22 is formed to cover part of the relay electrode 111 and the resin layer 8. The protective layer 22 is formed of a material having flexibility. The protective layer 22 is formed of an organic resin material for instance. It is noted that a stack of the base 7 through the protective layer 22 is referred to as a TFT layer 300. The TFT layer 300 includes, but not limited to, a power supply wire and a signal transmission wire, which are not shown.

The resin layer 8 emits gas in some cases in response to a temperature rise during a heat process, which is included in a method for manufacturing the display device 1, and during the use of the display device 1. However, the inorganic insulating layer 9, which has the opening 10, enables gas emitted from the resin layer 8, located under the inorganic insulating layer 9, to be released upward from the opening 10. As a result, gas accumulation between the resin layer 8 and the inorganic insulating layer 9 can be prevented. Consequently, removal of the resin layer 8 and inorganic insulating layer 9 is prevented.

Figure 3:
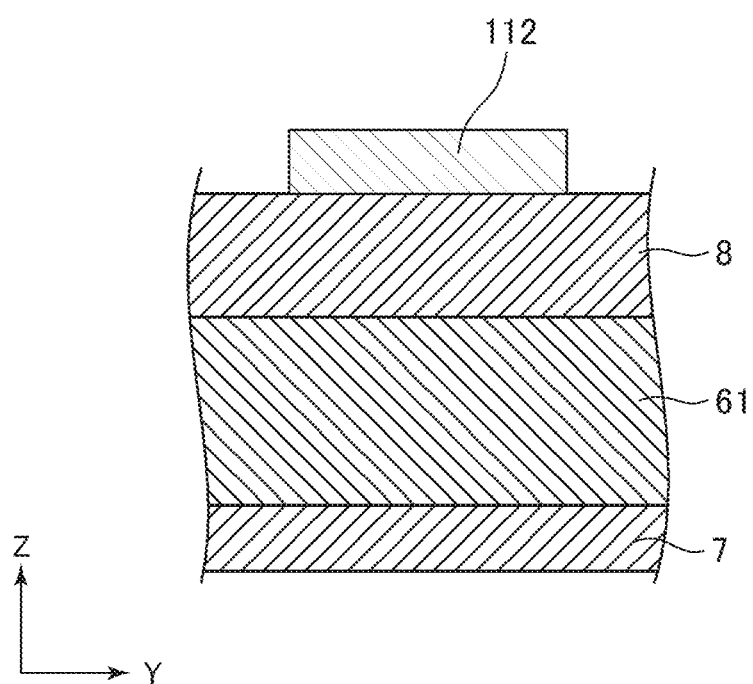
FIG. 3 is a sectional view of a comparative example.

The following describes a reason why the inorganic insulating layer 9 needs to be on the resin layer 8. FIG. 3 is a sectional view of a comparative example, where no inorganic insulating layer 9 is provided on the resin layer 8. FIG. 3 illustrates a wire layer 112, which is formed by partially removing a conductive layer stacked on the entire surface of the resin layer 8 through dry etching. As seen from FIG. 3, the resin layer 8 is exposed except a portion where the wire layer 112 is located. Accordingly, the surface of the resin layer 8 exposed during the dry etching undergoes damage. Dust is accordingly generated from the surface of the resin layer 8, and the dust causes faulty wire formation, such as film residues resulting from faulty etching. Accordingly, the inorganic insulating layer 9 needs to be provided on the resin layer 8 so that the resin layer 8 is not exposed during the dry etching. However, gas emitted from the resin layer 8 cannot escape, as described earlier, if the entire surface of the resin layer 8 is covered with the inorganic insulating layer 9. Hence, the opening 10 needs to be provided to let gas go.

As seen from FIG. 2, the edge of the inorganic insulating layer 9 surrounds the edge of the relay electrode 111. That is, the inorganic insulating layer 9 is larger than the relay electrode 111. Thus, all relay electrodes 111 are placed on the inorganic insulating layer 9. This can reduce damage to the resin layer 8 that is caused by etching for forming the relay electrodes 111. That is, a method of reducing damage that is caused by etching in the present disclosure is applicable also to a conductor provided in the same layer as the conductive pattern 11 provided in the bending portion B, which will be described later on, and provided also in a location other than the bending portion B, and this method is applicable also to the relay electrodes 111 for instance.

The light-emitting element 230 having a stack of, in sequence, a first electrode 231, a light-emitting layer 23 and a second electrode 233, and a light-emitting element layer 234 including an edge cover 232 are formed on the TFT layer 300. A sealing film 238 having a stack of, in sequence, a first inorganic film 235, an organic film 236 and a second inorganic film 237 is formed on the light-emitting element layer 234.

Figure 4:
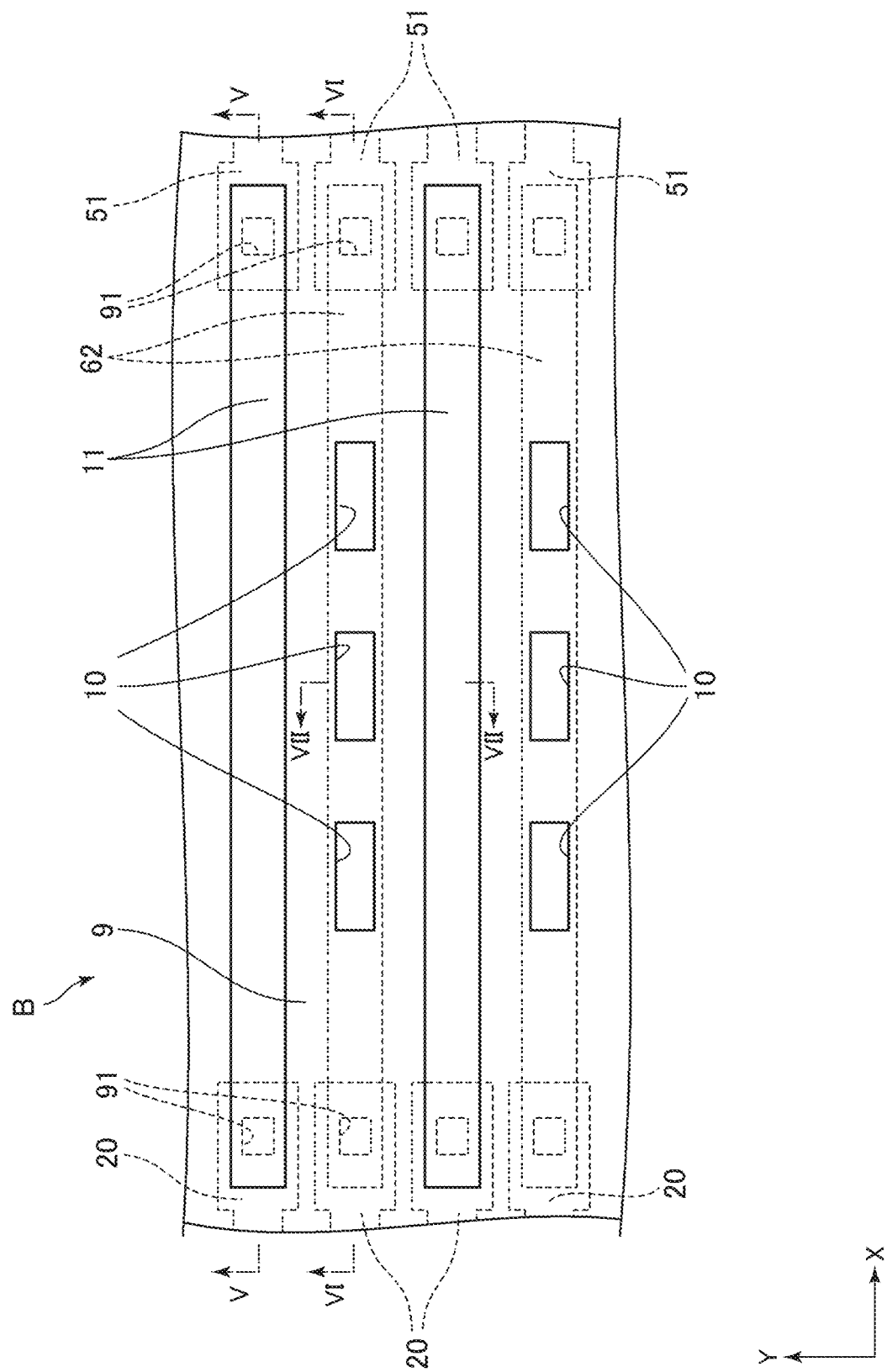
FIG. 4 is a partial plan view of a bending portion according to the first embodiment.

FIG. 4 is a schematic plan view of the vicinity of the end of the display region 2 and of the frame region F in FIG. 1 in the display device 1 according to the first embodiment. The illustration of the protective layer 22 is omitted in FIG. 4 for simplification; FIG. 4 is a plan view of a portion under the conductive pattern 11. As seen from FIG. 1 and FIG. 4, the bending portion B is provided in the frame region F.

As seen from FIG. 4, the conductive pattern 11 extends in the X-direction. One of the ends of the conductive pattern 11 is connected to the first frame wire 20, and the other end of the conductive pattern 11 is electrically connected to the second frame wire 51. Although not shown, the first frame wire 20 connected to the conductive pattern 11 is electrically connected to the source electrode 32 of the TFT 3 in the display region 2. Further, although not shown, the second frame wire 51 connected to the conductive pattern 11 is electrically connected to a terminal in the terminal section T.

Figure 5:
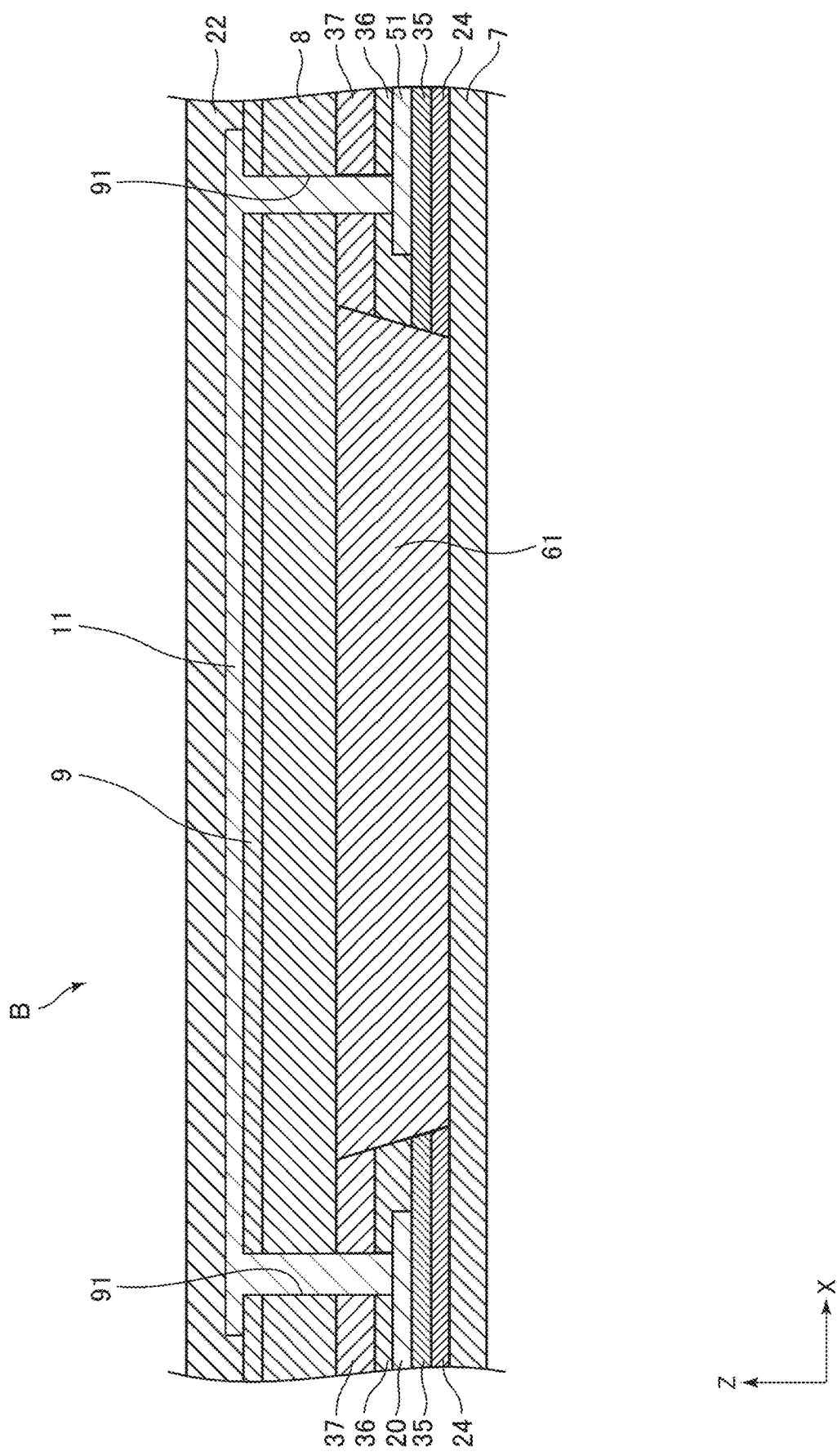
FIG. 5 is a sectional view taken along line V-V in FIG. 4.

The bending portion B is provided with a wire 62 extending along the conductive pattern 11, as illustrated in FIG. 4. The wire 62 is provided between a filling layer 61 and the resin layer 8, as illustrated in FIG. 5, which will be detailed later on. One of the ends of the wire 62 is connected to the first frame wire 20, and the other end of the wire 62 is electrically connected to the second frame wire 51. Although not shown, the wire 62 electrically connects a circuit that is identical to a circuit to which the conductive pattern 11 is connected, to the TFT 3 via the first frame wire 20 and second frame wire 51. The wire 62 is formed of a conductive material.

The TFT 3 within a pixel 21 and a terminal are electrically connected together by each of the wire 62 and the conductive pattern 11. Accordingly, a control circuit, which is not shown, connected to the terminal section T controls the respective light-emitting elements 230 and TFTs 3 within the plurality of pixels 21, thereby displaying an image in the display region 2.

Figure 6:
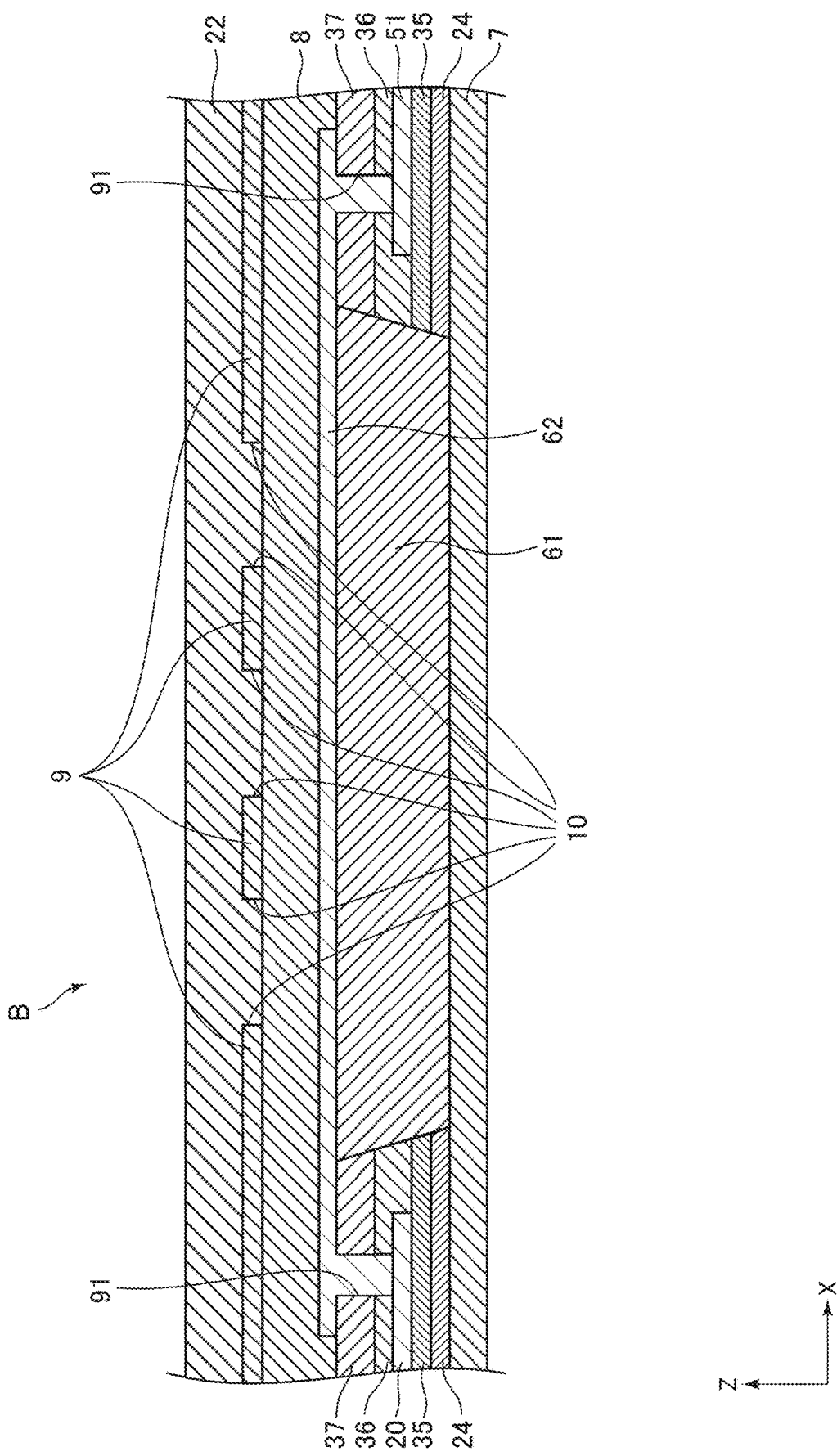
FIG. 6 is a sectional view taken along line VI-VI in FIG. 4.

FIG. 5 is a sectional view taken along line V-V in FIG. 4. FIG. 6 is a sectional view taken along line VI-VI in FIG. 4. As illustrated in FIG. 4, the bending portion B includes the filling layer 61, the wire 62, the resin layer 8, and the inorganic insulating layer 9 all provided above the base 7. The inorganic insulating layer 9 has a plurality of openings 10, as seen from FIG. 4 and FIG. 6.

The filling layer 61 is a layer for reducing the difference between the height of the upper surface of the second interlayer film 37 and the height of the upper surface of the base 7 in the bending portion B. The filling layer 61 prevents the wire 62 from cracking and breakage that results from the above heights. The filling layer 61 is formed of a material having flexibility. The filling layer 61 is formed of an organic resin material for instance.

The resin layer 8 is typically a flattening film and is a layer for reducing a level difference on the surface in the display region 2. The resin layer 8 is disposed above the base 7 in the bending portion B. The resin layer 8 is formed of a material having flexibility. The resin layer 8 is formed of an organic resin material for instance.

The inorganic insulating layer 9 is a layer for covering the resin layer 8 for protection. The inorganic insulating layer 9 is preferably thin as much as possible so that the bending portion B is not difficult to bend. The inorganic insulating layer 9 is 100 to 400 nm thick for instance.

The conductive pattern 11 is provided on the inorganic insulating layer 9 in a location except a location over the opening 10, as seen from the configuration illustrated in FIG. 4 and FIG. 5. That is, the conductive pattern 11, which is provided in the same layer as a layer where the relay electrode 111 illustrated in FIG. 2 is provided, can be formed of the same material as the relay electrode 111. The relay electrode 111 is provided in only the display region 2, and the conductive pattern 11 is provided in only the bending portion B. As illustrated in FIG. 5, one of the ends of the conductive pattern 11, formed in the bending portion B, is electrically connected to one of the ends of the first frame wire 20 via the contact hole 91 provided in the first interlayer film 36, second interlayer film 37, resin layer 8 and inorganic insulating layer 9 on the one end of the first frame wire 20. Further, although not shown, the other end of the first frame wire 20 is electrically connected to an end of a source line (not shown) in the display region 2 via the contact hole 91 provided in the first interlayer film 36, second interlayer film 37, resin layer 8 and inorganic insulating layer 9 on the other end of the first frame wire 20. Furthermore, the source line not shown is electrically connected to the source electrode 32 of the TFT 3 in FIG. 2. As illustrated in FIG. 2, the drain electrode 31 of the TFT 3 is electrically connected to the relay electrode 111 in the display region 2 via the contact hole 9a, provided in the inorganic insulating layer 9 on the drain electrode 31, and via the contact hole 8a, provided in the resin layer 8 on the drain electrode 31.

A plurality of conductive patterns 11 are arranged in the Y-direction, as seen from FIG. 4 and FIG. 6. Three openings 10 for instance are spaced from each other in the X-direction between the plurality of conductive patterns 11. However, any number of openings 10 may be provided. Further, the openings 10 may be provided in any location. Further, each opening 10 may have any size and any shape. In addition, the shape of the outline of the opening 10 in a plan view is not limited to such a rectangular shape as illustrated in FIG. 4; the outline of the opening 10 may have any shape in a plan view, including a circular shape, an elliptic shape, and a square shape. That is, the opening 10 formed in the conductive pattern 11 may be any opening that allows gas emitted by the resin layer 8 to pass to the protective layer 22.

Figure 7:
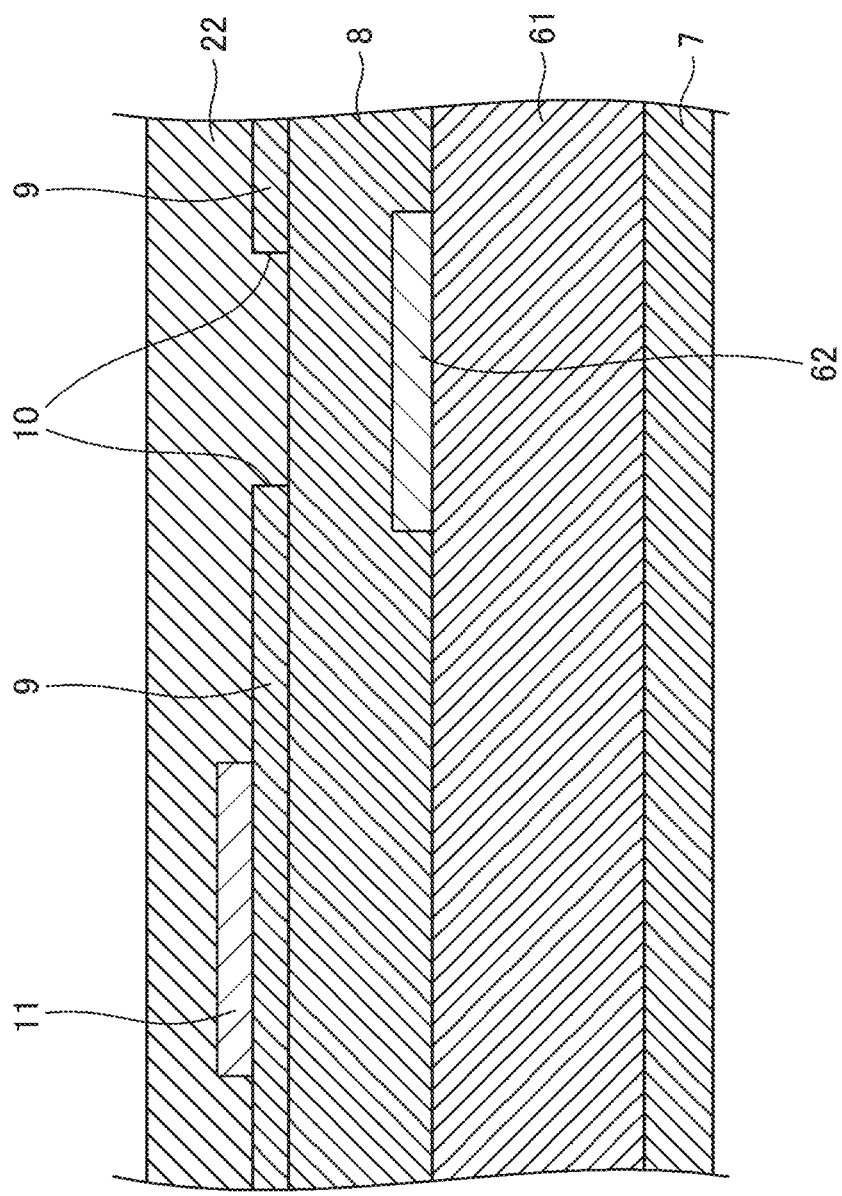
FIG. 7 is a sectional view taken along line VII-VII in FIG. 4.

FIG. 7 is a sectional view taken along line VII-VII in FIG. 4. As seen from FIG. 7, gas emitted in the resin layer 8 can flow above the inorganic insulating layer 9 by way of the protective layer 22 within the opening 10. That is, providing, on the resin layer 8, a portion where no inorganic insulating layer 9 is disposed forms a path through which gas emitted from the resin layer 8 can move above the inorganic insulating layer 9. Accordingly, gas emitted in the resin layer 8 less accumulates between the inorganic insulating layer 9 and the resin layer 8. This can prevent detachment between the inorganic insulating layer 9 and the resin layer 8, or cracking in the inorganic insulating layer 9.

Second Embodiment

Figure 8:
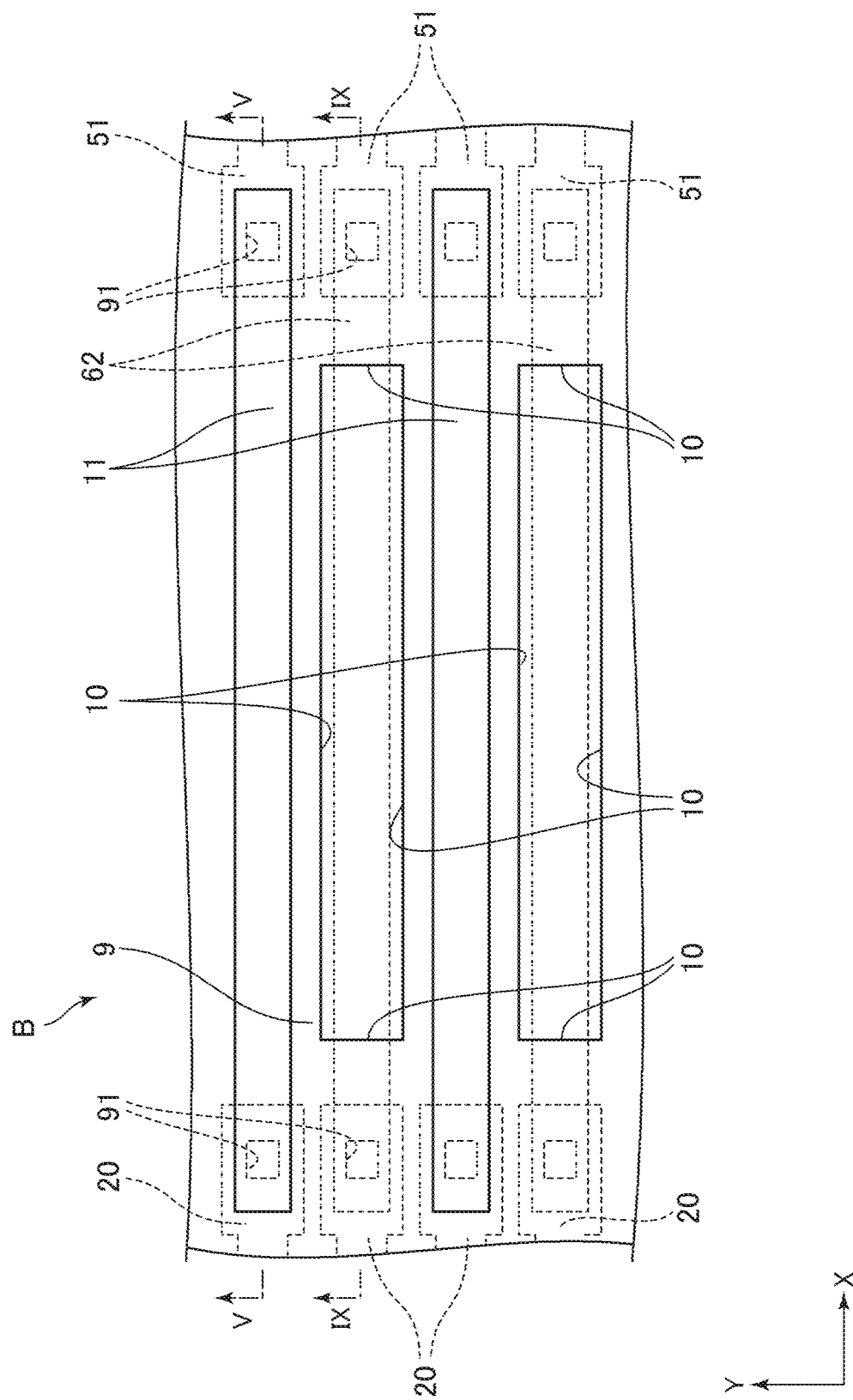
FIG. 8 is a partial plan view of a bending portion according to a second embodiment.

A second embodiment of the present disclosure will be described. The second embodiment is different from the first embodiment in the shape of the opening 10. Descriptions common to those in the first embodiment will be omitted as appropriate. FIG. 8 is a schematic plan view of the vicinity of the end of the display region 2 and of the frame region F in the display device 1 according to the second embodiment. The illustration of the protective layer 22 is omitted in FIG. 8 for simplification; FIG. 8 is a plan view of a portion under the conductive pattern 11.

It is noted that the sectional structure along the conductive pattern 11 extending in the X-direction in FIG. 8 is the same as the sectional structure illustrated in FIG. 5, which relates to the first embodiment. Thus, FIG. 8 illustrates line V-V, which denotes the sectional position along the conductive pattern 11 extending in the X-direction. The following describes the second embodiment with reference to FIG. 5 in relation to the section taken along line V-V in FIG. 8.

In the second embodiment, the opening 10 extends in the X-direction throughout the bending portion B, as illustrated in FIG. 8. The opening 10 also extends along the conductive pattern 11. That is, the opening 10 and the conductive pattern 11 extend in almost parallel.

The inorganic insulating layer 9 is wider than the conductive pattern 11, overlapping the inorganic insulating layer 9 in a plan view, in the Y-direction, as seen from FIG. 8. Thus, the edge of the inorganic insulating layer 9 extends along the edge of the conductive pattern 11 in a plan view. This can reduce damage to the resin layer 8 during etching for forming the conductive pattern 11.

Figure 9:
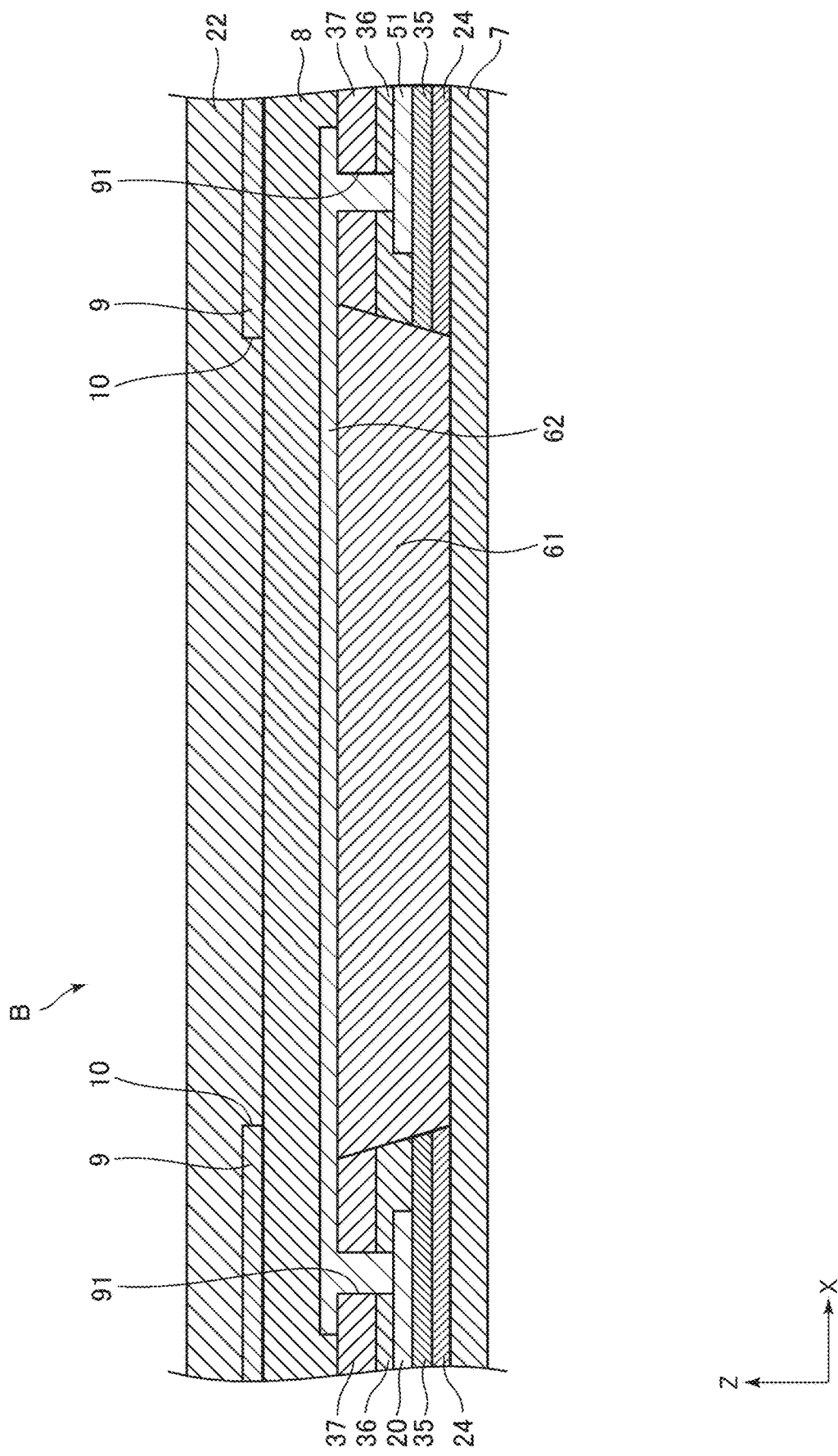
FIG. 9 is a sectional view taken along line IX-IX in FIG. 8.

FIG. 9 is a sectional view taken along line IX-IX in FIG. 8. As seen from the comparison between FIG. 6 and FIG. 9, the opening 10 according to the second embodiment has a larger occupied area than the opening 10 according to the first embodiment. This enables gas emitted by the resin layer 8 to be more efficiently guided above the inorganic insulating layer 9.

The conductive pattern 11 is provided on the inorganic insulating layer 9 in a location except a location over the opening 10, as seen from FIG. 5 and FIG. 8. That is, the conductive pattern 11, which is provided in the same layer as a layer where the relay electrode 111 shown in FIG. 2 is provided, can be formed of the same material as the relay electrode 111. The relay electrode 111 is provided in only the display region 2, and the conductive pattern 11 is provided in only the bending portion B. As illustrated in FIG. 5, one of the ends of the conductive pattern 11, formed in the bending portion B, is electrically connected to one of the ends of the first frame wire 20 via the contact hole 91 provided in the first interlayer film 36, second interlayer film 37, resin layer 8 and inorganic insulating layer 9 on the one end of the first frame wire 20. Further, although not shown, the other end of the first frame wire 20 is electrically connected to an end of a source line (not shown) in the display region 2 via the contact hole 91 provided in the first interlayer film 36, second interlayer film 37, resin layer 8 and inorganic insulating layer 9 on the other end of the first frame wire 20. Furthermore, the source line not shown is electrically connected to the source electrode 32 of the TFT 3 in FIG. 2. As illustrated in FIG. 2, the drain electrode 31 of the TFT 3 is electrically connected to the relay electrode 111 in the display region 2 via the contact hole 9a, provided in the inorganic insulating layer 9 on the drain electrode 31, and via the contact hole 8a, provided in the resin layer 8 on the drain electrode 31.

Third Embodiment

Figure 10:
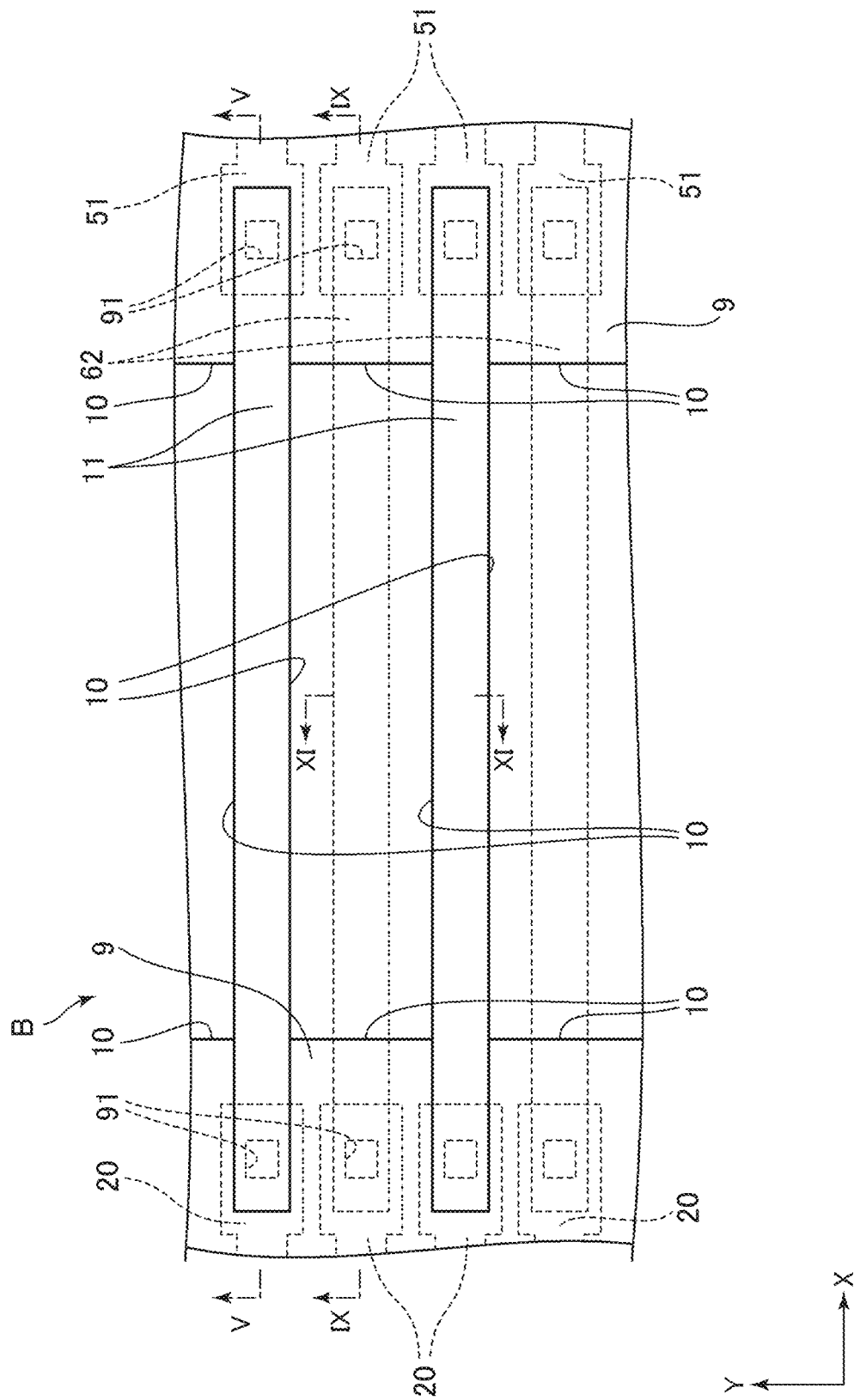
FIG. 10 is a partial plan view of a bending portion according to a third embodiment.
Figure 11:
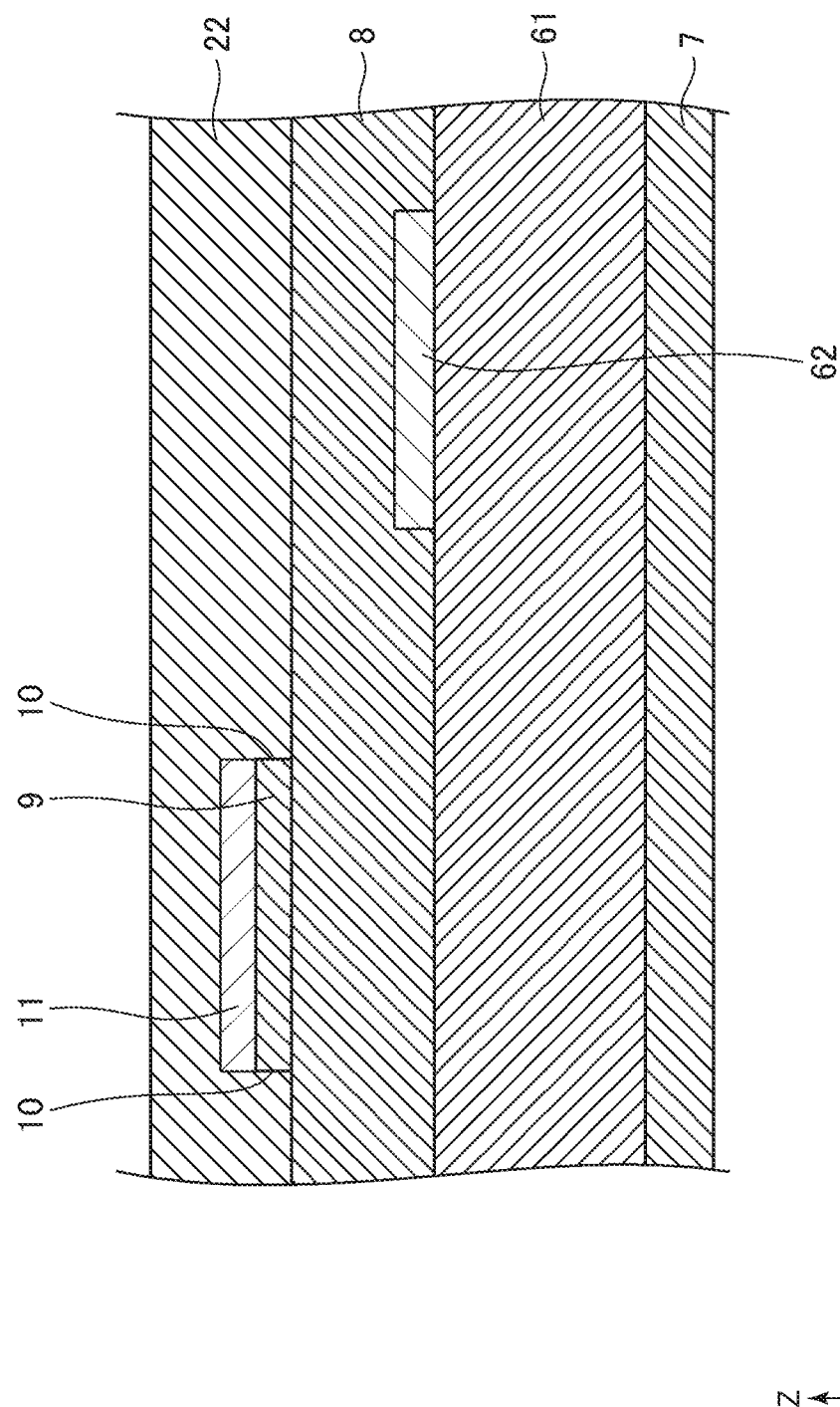
FIG. 11 is a sectional view taken along line XI-XI in FIG. 10.

A third embodiment of the present disclosure will be described. This embodiment is different from the first embodiment and second embodiment in the shape of the opening 10. Descriptions common to those in the first embodiment and second embodiment will be omitted as appropriate in this embodiment. FIG. 10 is a plan view of the vicinity of the end of the display region 2 and of the frame region F in the display device 1 according to the third embodiment. FIG. 11 is a sectional view taken along line XI-XI in FIG. 10. The illustration of the protective layer 22 is omitted in FIG. 10 for simplification; FIG. 10 is a plan view of a portion under the conductive pattern 11.

It is noted that the sectional structure along the conductive pattern 11 extending in the X-direction in FIG. 10 is the same as the sectional structure illustrated in FIG. 5, which relates to the first embodiment. Thus, FIG. 10 illustrates line V-V, which denotes the sectional position along the conductive pattern 11 extending in the X-direction. The following describes the third embodiment with reference to FIG. 5 in relation to the section taken along line V-V in FIG. 10.

It is noted that the sectional structure along the wire 62 extending in the X-direction in FIG. 10 is the same as the sectional structure illustrated in FIG. 9, which relates to the second embodiment. Thus, FIG. 10 illustrates line IX-IX, which denotes the sectional position along the wire 62 extending in the X-direction. The following describes the third embodiment with reference to FIG. 9 in relation to the section taken along line IX-IX in FIG. 10.

The opening 10 of the inorganic insulating layer 9 is provided in all locations but a location under the conductive pattern 11, as seen from FIG. 9, FIG. 10 and FIG. 11. That is, the inorganic insulating layer 9 is removed in the bending portion B except a location overlapping the conductive pattern 11 in a plan view, as illustrated in FIG. 11.

The inorganic insulating layer 9 is almost as wide as the conductive pattern 11, overlapping the inorganic insulating layer 9 in a plan view, in the Y-direction, as seen from FIG. 10 and FIG. 11. Accordingly, the area of the opening 10 further increases, thus enabling gas emitted by the resin layer 8 to be further efficiently released above the inorganic insulating layer 9.

The conductive pattern 11 is provided on the inorganic insulating layer 9 in a location except a location over the opening 10, as seen from FIG. 5 and FIG. 10. That is, the conductive pattern 11, which is provided in the same layer as a layer where the relay electrode 111 shown in FIG. 2 is provided, can be formed of the same material as the relay electrode 111. The relay electrode 111 is provided in only the display region 2, and the conductive pattern 11 is provided in only the bending portion B. As illustrated in FIG. 5, one of the ends of the conductive pattern 11, formed in the bending portion B, is electrically connected to one of the ends of the first frame wire 20 via the contact hole 91 provided in the first interlayer film 36, second interlayer film 37, resin layer 8 and inorganic insulating layer 9 on the one end of the first frame wire 20. Further, although not shown, the other end of the first frame wire 20 is electrically connected to an end of a source line (not shown) in the display region 2 via the contact hole 91 provided in the first interlayer film 36, second interlayer film 37, resin layer 8 and inorganic insulating layer 9 on the other end of the first frame wire 20. Furthermore, the source line not shown is electrically connected to the source electrode 32 of the TFT 3 in FIG. 2. As illustrated in FIG. 2, the drain electrode 31 of the TFT 3 is electrically connected to the relay electrode 111 in the display region 2 via the contact hole 9a, provided in the inorganic insulating layer 9 on the drain electrode 31, and via the contact hole 8a, provided in the resin layer 8 on the drain electrode 31.

Method for Manufacturing Display Device of Present Disclosure

FIG. 12 to FIG. 17 are sectional views of structures in a first process step through a sixth process step all included in a method for manufacturing the display device 1 of the present disclosure. Although FIG. 12 through FIG. 17 illustrate, by way of example, a method for producing the structure of the bending portion B described in the third embodiment, the method for manufacturing the display device 1 of the present disclosure is applicable also to a method for producing the structures described in the first embodiment and second embodiment, or to a method for producing the structure of the display region 2 in each embodiment.

Figure 17:
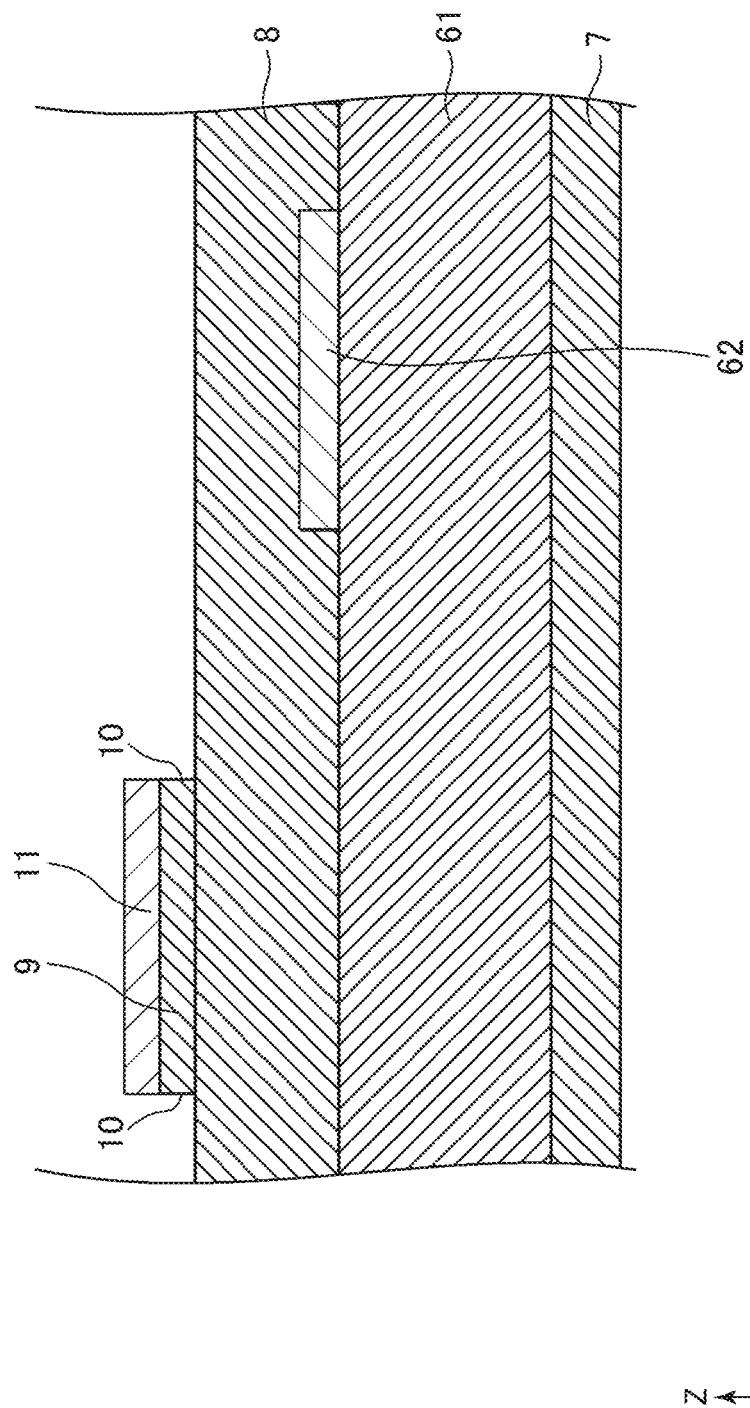
FIG. 17 is a sectional view of the structure of the semi-manufactured product in a sixth process step included in the manufacturing method according to the present disclosure.
Figure 18:
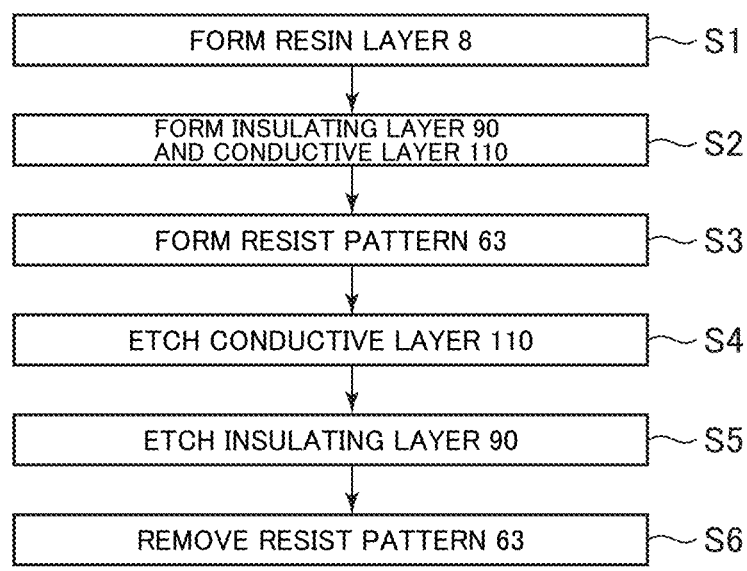
FIG. 18 is a flowchart showing the first to sixth process steps in the method for manufacturing the display device of the present disclosure.

FIG. 18 is a flowchart showing the first process step through sixth process step in the method for manufacturing the display device 1 of the present disclosure. The first process step, S1, through the sixth process step, S6, are performed sequentially. FIG. 12 through FIG. 17 are sectional views of structures immediately after the respective process steps: first process step S1 through sixth process step S6.

Figure 12:
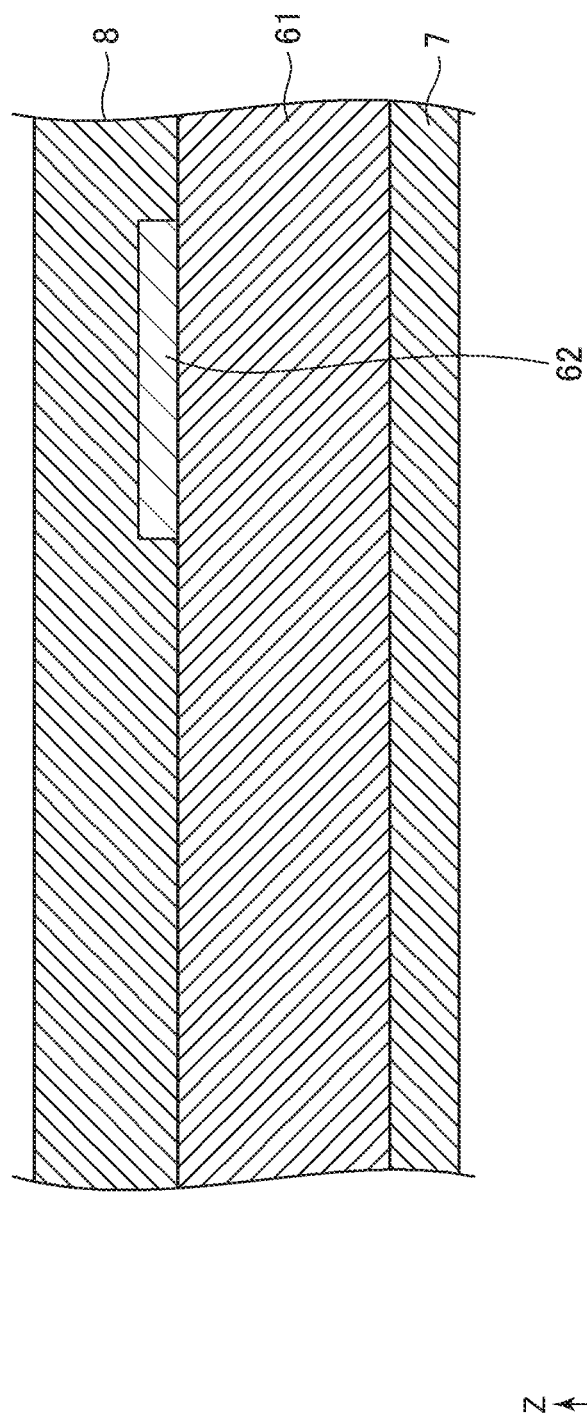
FIG. 12 is a sectional view of the structure of a semi-manufactured product in a first process step included in a method for manufacturing the display device of the present disclosure.

First process step S1 is forming the filling layer 61 onto the base 7, and forming the resin layer 8 so as to cover the wire 62 pattered on the filling layer 61, as illustrated in FIG. 12.

Figure 13:
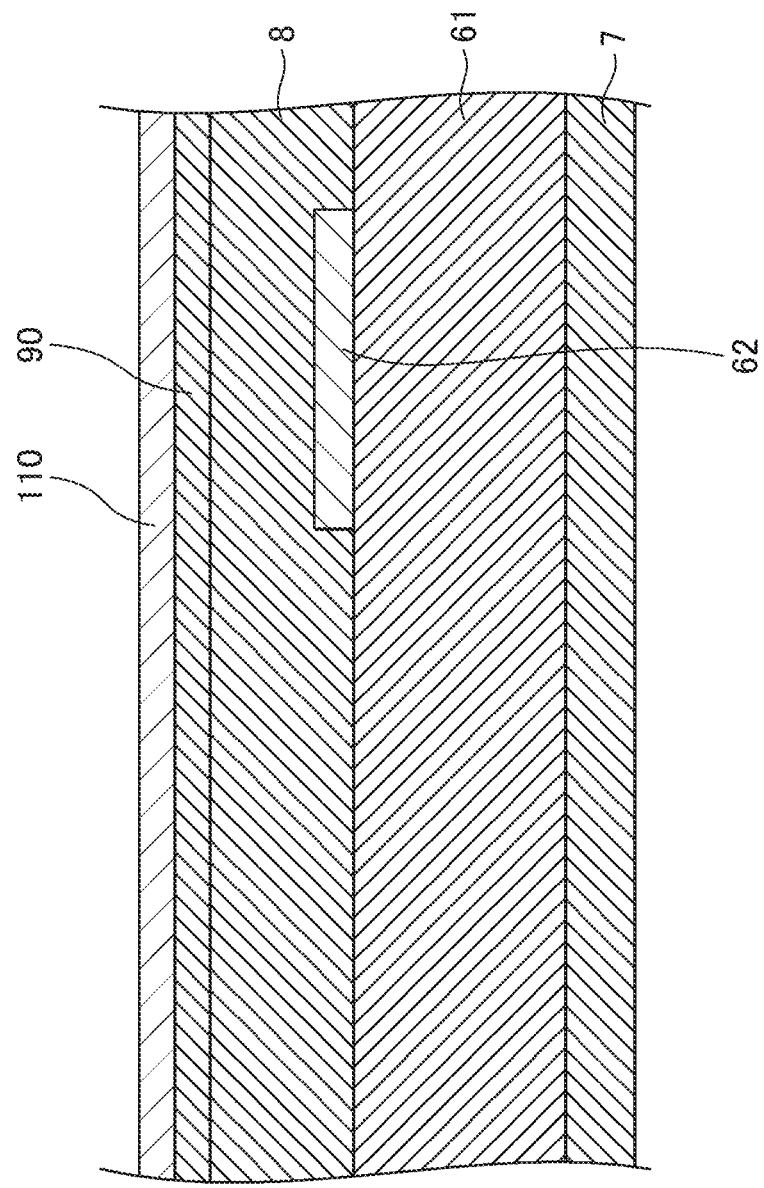
FIG. 13 is a sectional view of the structure of the semi-manufactured product in a second process step included in the method for manufacturing the display device of the present disclosure.

Next, second process step S2 is forming an insulating layer 90, which constitutes the inorganic insulating layer 9, onto the resin layer 8, as illustrated in FIG. 13. Thereafter, the insulating layer 90, which constitutes the inorganic insulating layer 9, undergoes sputtering to form a conductive layer 110, which constitutes the conductive pattern 11.

Figure 14:
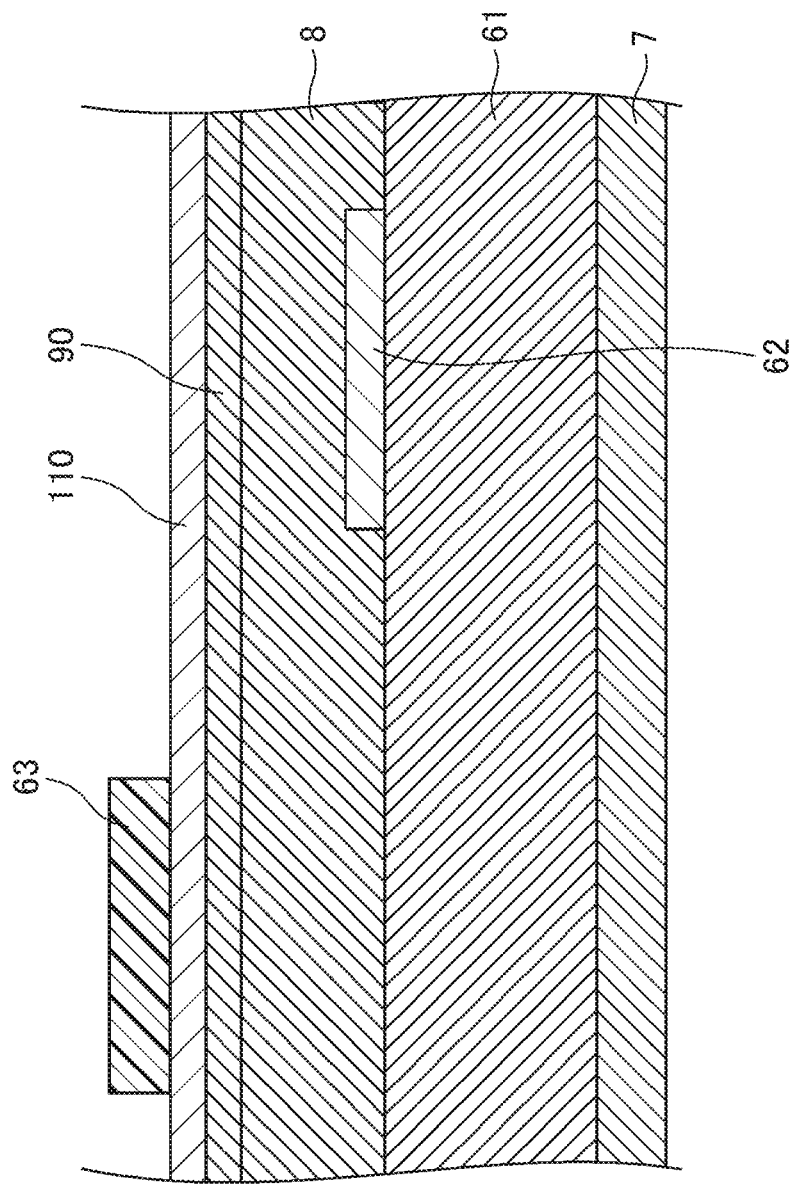
FIG. 14 is a sectional view of the structure of the semi-manufactured product in a third process step included in the method for manufacturing the display device of the present disclosure.

Next, third process step S3 is applying a resist onto the conductive layer 110 in order to subject the conductive layer 110 to patterning, as illustrated in FIG. 14. The resist undergoes patterning through, but not limited to, lithography. This forms a resist pattern 63, as illustrated in FIG. 14.

Figure 15:
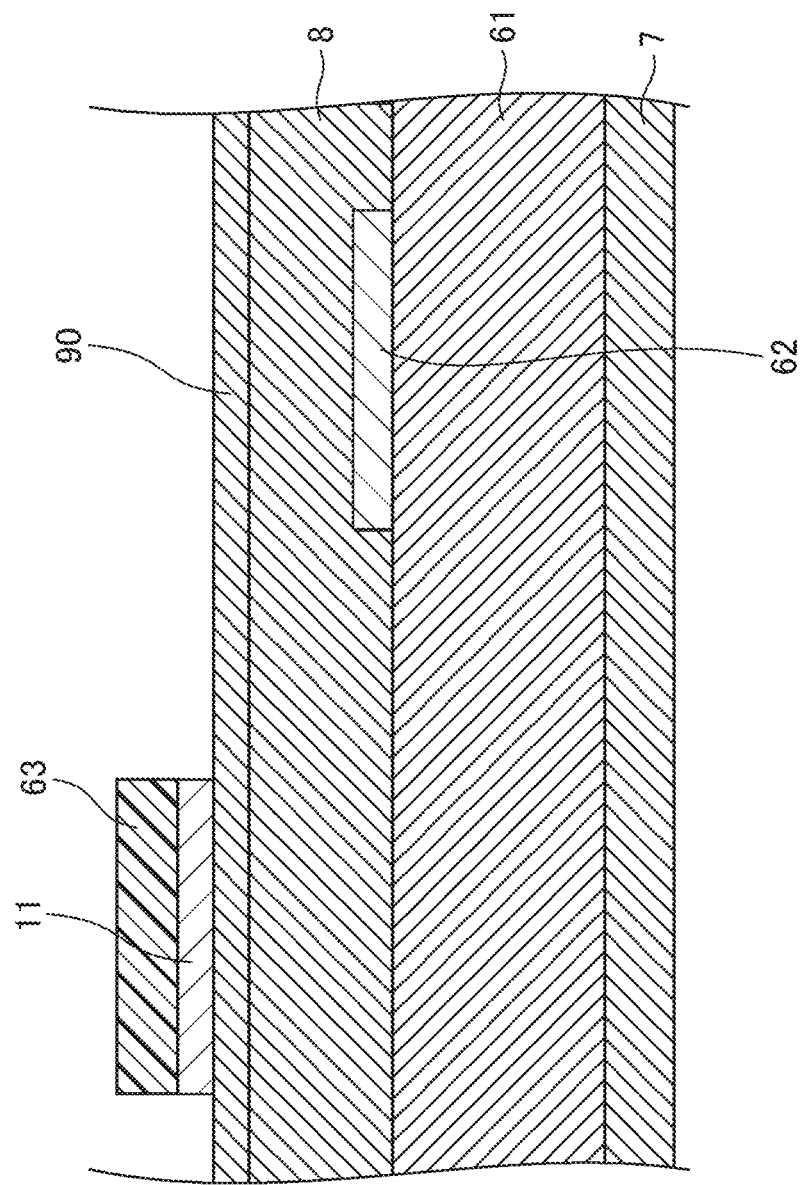
FIG. 15 is a sectional view of the structure of the semi-manufactured product in a fourth process step included in the method for manufacturing the display device of the present disclosure.

Next, fourth process step S4 is removing the conductive layer 110 through etching with the resist pattern 63 as an etching mask, as illustrated in FIG. 15. Accordingly, the conductive pattern 11 remains under the resist pattern 63, as illustrated in FIG. 14. That is, the conductive layer 110 excluding a portion covered with the resist pattern 63 undergoes etching for removal, thus forming the conductive pattern 11 onto the inorganic insulating layer 9.

Figure 16:
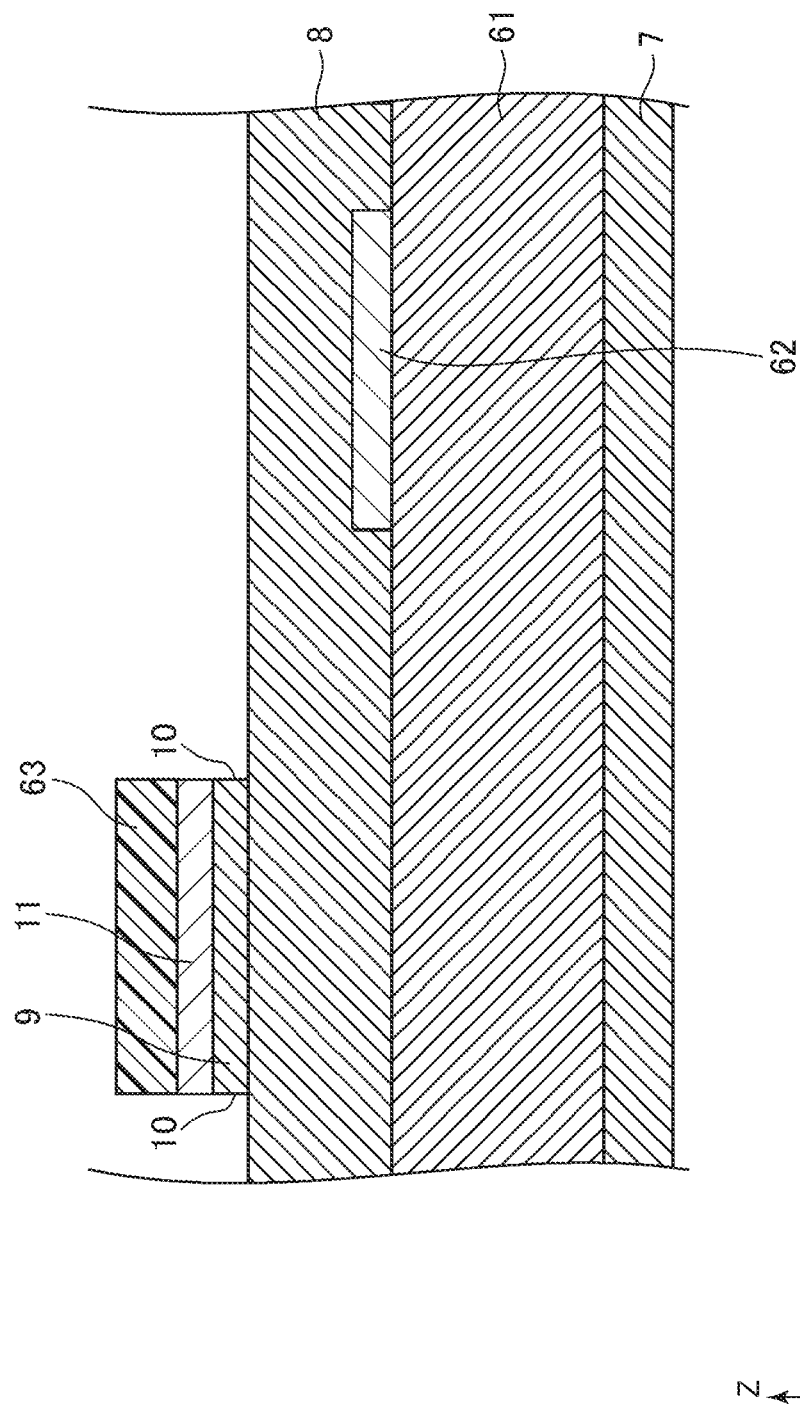
FIG. 16 is a sectional view of the structure of the semi-manufactured product in a fifth process step included in the manufacturing method according to the present disclosure.

Next, fifth process step S5 is etching the insulating layer 90 with the resist pattern 63 as an etching mask, as illustrated in FIG. 16. Accordingly, the inorganic insulating layer 9 remains under the resist pattern 63 and the conductive pattern 11, thus forming the structure illustrated in FIG. 16. A portion with the insulating layer 90 removed, except under the resist pattern 63 constitutes the opening 10. A fourth embodiment describes removing the insulating layer 90 except under the conductive pattern 11 by way of example. In this case, the opening 10 can be provided without an additional photolithography process step.

Next, sixth process step S6 is removing the resist pattern 63 on the conductive pattern 11 through ashing and resist removal, as illustrated in FIG. 17. After the structure illustrated in FIG. 17 is formed, gas emitted from the resin layer 8 during heating can be released upward from the opening 10.

In the method for manufacturing the display device 1 of the present disclosure, removing the insulating layer 90 except under the conductive pattern 11 is described by way example However, in the foregoing embodiments, the opening 10 may be provided in such a manner that the inorganic insulating layer 9 remains also in, for instance, a portion except under the conductive pattern 11, as seen from FIG. 4 and FIG. 8. In this case, fourth process step S4 is performed, followed by removing the resist pattern 63 once from the structure illustrated in FIG. 15. Then, a photolithography process step for patterning the insulating layer 90 is performed anew to provide the opening 10.

Further, in the method for manufacturing the display device 1 of the present disclosure, a similar manufacturing method is applicable also to the display region 2 by replacing the conductive pattern 11 with the relay electrode 111.

The invention claimed is:

1. A display device comprising:
   a display region including a thin-film transistor;
   a frame region surrounding the display region;
   a terminal section provided in the frame region;
   a resin layer provided above a base;
   an inorganic insulating layer provided on the resin layer and including openings;
   conductive patterns provided on the inorganic insulating layer in locations except for locations over the openings; and
   a bending portion provided between the display region and the terminal section and provided with the resin layer, the inorganic insulating layer, and a plurality of the conductive patterns,
   wherein the conductive patterns electrically connect the terminal section and the thin-film transistor together; and
   a plurality of the openings is provided at intervals between the plurality of the conductive patterns along an extending direction of the conductive patterns.

2. The display device according to claim 1, wherein the thin-film transistor is provided between the base and the resin layer, and
   the conductive patterns is electrically connected to a drain electrode of the thin-film transistor.

3. The display device according to claim 1, wherein in the inorganic insulating layer, the openings are provided in all locations except for under the conductive patterns.

4. The display device according to claim 1, wherein an edge of the inorganic insulating layer surrounds an edge of the conductive patterns in a plan view.

\* \* \* \* \*